(12) United States Patent
Xiao et al.

(10) Patent No.: US 12,032,498 B2
(45) Date of Patent: Jul. 9, 2024

(54) HYBRID STORAGE DEVICE AND ACCESS METHOD

(71) Applicant: Huawei Technologies Co., Ltd., Shenzhen (CN)

(72) Inventors: Yongjun Xiao, Shanghai (CN); Fei Kong, Shanghai (CN); Jianfeng Geng, Shanghai (CN); Biao He, Shanghai (CN); Dengwei Xia, Shanghai (CN); Guangyu Zhang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 461 days.

(21) Appl. No.: 17/231,383

(22) Filed: Apr. 15, 2021

(65) Prior Publication Data

US 2021/0232512 A1    Jul. 29, 2021

Related U.S. Application Data

(63) Continuation of application No. PCT/CN2018/110359, filed on Oct. 16, 2018.

(51) Int. Cl.
*G06F 13/16* (2006.01)
*G11C 16/04* (2006.01)
*G11C 16/10* (2006.01)
*G11C 16/26* (2006.01)

(52) U.S. Cl.
CPC .......... *G06F 13/1668* (2013.01); *G11C 16/10* (2013.01); *G11C 16/26* (2013.01); *G11C 16/0483* (2013.01)

(58) Field of Classification Search
None
See application file for complete search history.

(56) References Cited

U.S. PATENT DOCUMENTS

| 5,701,516 A | 12/1997 | Cheng et al. |
| 2007/0288683 A1 | 12/2007 | Panabaker et al. |
| 2010/0088467 A1 | 4/2010 | Lee et al. |
| 2011/0202707 A1* | 8/2011 | Moon .................... G06F 3/0604 711/E12.001 |

(Continued)

FOREIGN PATENT DOCUMENTS

| CN | 101473438 A | 7/2009 |
| CN | 103198039 A | 7/2013 |

(Continued)

*Primary Examiner* — Idriss N Alrobaye
*Assistant Examiner* — Dayton Lewis-Taylor
(74) *Attorney, Agent, or Firm* — Conley Rose, P.C.

(57) ABSTRACT

A hybrid storage device includes an interface configured to electrically couple the hybrid storage device to an external device, and exchange data with the external device, a plurality of storage channels electrically coupled to the interface and configured to exchange the data with the interface, a plurality of chip select lines, where each of the chip select lines is electrically coupled to one storage channel in the storage channels and configured to exchange the data with the one storage channel, and a plurality of storage medium particles, where each of the storage medium particles is electrically coupled to one chip select line and configured to exchange the data with the one chip select line. The storage medium particles include a non-volatile random-access memory (NVRAM) and a flash memory.

14 Claims, 7 Drawing Sheets

(56) References Cited

U.S. PATENT DOCUMENTS

| | | |
|---|---|---|
| 2012/0096246 A1 | 4/2012 | Pio |
| 2013/0279249 A1 | 10/2013 | Yun et al. |
| 2014/0281661 A1* | 9/2014 | Milton ............... G11C 29/4401 |
| | | 714/2 |
| 2014/0365715 A1 | 12/2014 | Lee |
| 2015/0186267 A1* | 7/2015 | Chun .................... G06F 1/3225 |
| | | 711/202 |
| 2016/0378359 A1 | 12/2016 | Jang et al. |
| 2017/0068476 A1 | 3/2017 | Hayes et al. |
| 2018/0005670 A1 | 1/2018 | Lee et al. |
| 2018/0261260 A1 | 9/2018 | Hirashima et al. |
| 2019/0018809 A1 | 1/2019 | Nale et al. |

FOREIGN PATENT DOCUMENTS

| | | |
|---|---|---|
| CN | 103324578 A | 9/2013 |
| CN | 107039059 A | 8/2017 |
| CN | 107391397 A | 11/2017 |

\* cited by examiner

HYBRID STORAGE DEVICE AND ACCESS METHOD

CROSS-REFERENCE TO RELATED APPLICATIONS

This application is a continuation of International Patent Application No. PCT/CN2018/110359 filed on Oct. 16, 2018, the disclosure of which is hereby incorporated by reference in its entirety.

TECHNICAL FIELD

This application relates to the field of storage technologies, and in particular, to a hybrid storage device and an access method.

BACKGROUND

Increasingly more data needs to be stored with the rapid development of the Internet. There are two types of memories: a random-access memory (RAM) where data is lost upon power failure, and a read-only memory (ROM) where data is not lost upon power failure. In the mobile terminal field, an electronic product including but not limited to a mobile phone, a tablet (or a pad), and a notebook computer has both a RAM and a ROM or NAND flash. The RAM may be, for example, a low-power double data rate (LPDDR) memory, a third-generation LPDDR (LPDDR3) memory, or a fourth-generation LPDDR (LPDDR4) memory, and is configured to load and run a program, or the like. The ROM or NAND flash may be, for example, an embedded MultiMediaCard (eMMC) or a Universal Flash Storage (UFS), and is configured to store a system file and user data (for example, a photo, a movie, or an application (APP)). The RAM features a high access speed and a data loss upon power failure (volatility), while the ROM features a low access speed and no data loss upon power failure (non-volatility).

In a storage solution, as shown in FIG. 1, a volatile controller is integrated in a system on chip (SoC) and configured to externally connect to an LPDDR memory, for example, an LPDDR3 or LPDDR4 memory. Furthermore, a non-volatile controller is integrated and configured to connect to an external NAND flash, for example, an eMMC 4.5/5.0/5.1 or a UFS 2.0/2.1. The LPDDR memory has high performance, a low access latency, long read/write endurance, a relatively small capacity, a high price at a unit of gigabit (Gbit), and a data loss upon power failure. On the contrary, the NAND flash has low performance, a high access latency, short read/write endurance, a relatively large capacity, a low price at a unit of Gbit, and no data loss upon power failure.

In the existing solution, due to cost limitation, the LPDDR memory has a limited capacity. In a high-memory application scenario (for example, photographing), some processes originally residing in the LPDDR memory need to be terminated, or memory compression (ZRAM) is used. When these processes need to be invoked again, these processes need to be reloaded or decompressed before running. This will cause a high latency when the system invokes the memory again, and efficiency of the system is low.

SUMMARY

Embodiments of this application provide a hybrid storage device and an access method, to improve overall storage performance of the storage device.

A first aspect of this application provides a hybrid storage device, including an interface, configured to electrically connect the hybrid storage device to an external device, and exchange data with the external device, at least one storage channel, electrically connected to the interface and configured to exchange the data with the interface, a plurality of chip select lines, where each chip select line is electrically connected to one storage channel in the at least one storage channel and configured to exchange the data with the one storage channel, and a plurality of storage medium particles, where each storage medium particle is electrically connected to one chip select line and configured to exchange the data with the chip select line. The plurality of storage medium particles include a non-volatile RAM (NVRAM) and a flash memory. In this embodiment of this application, an NVRAM is introduced to the storage medium particles, and features including high performance, long read/write endurance, and non-volatility of the NVRAM are used, thereby expanding a double data rate (DDR) synchronous dynamic RAM (SDRAM), improving overall storage performance of the hybrid storage device, reducing a system latency, and increasing system efficiency.

In a possible design, in a first implementation of the first aspect of the embodiments of this application, the at least one storage channel includes n storage channels, and the n storage channels include m first storage channels and n−m second storage channels. Each first storage channel is separately connected to j NVRAMs through j first chip select lines in the plurality of chip select lines, and each second storage channel is separately connected to k flash memories through k second chip select lines in the plurality of chip select lines. Both n and m are positive integers, n is greater than m, and both j and k are positive integers. The at least one storage channel is connected to the NVRAMs and the flash memories, and access control over the NVRAMs and the flash memories that are connected to the storage channels is implemented by controlling enabling of the storage channels.

In a possible design, in a second implementation of the first aspect of the embodiments of this application, the at least one storage channel includes n storage channels, each storage channel is connected to k chip select lines in the plurality of chip select lines, and the k chip select lines include j first chip select lines and k−j second chip select lines, where n, j, and k are all positive integers, and k is greater than j. Each first chip select line is connected to one NVRAM, and each second chip select line is connected to one flash memory. Chip select lines connected to a same storage channel are connected to an NVRAM and a NAND, and access control over the NVRAM and the NAND that are connected to each storage channel is implemented by controlling enabling of the chip select lines connected to the storage channel.

In a possible design, in a third implementation of the first aspect of the embodiments of this application, the at least one storage channel includes n storage channels, and each storage channel is connected to j chip select lines in the plurality of chip select lines, where n and j are positive integers. Each chip select line is connected to one NVRAM, and the NVRAM is further connected to one flash memory, to communicate the chip select line with the flash memory. The chip select line connected to each storage channel is connected to the NVRAM and the flash memory in series, and different operations are performed based on a type of an instruction and an address indicated by the instruction, to implement access control over the NVRAM and the flash memory that are connected in series on each storage channel.

Optionally, the flash memory is a NAND flash memory.

Optionally, the interface includes a physical layer device, configured to exchange data with the external device, and a controller, configured to enable one or more storage channels in the at least one storage channel, enable one or more chip select lines electrically connected to the one or more storage channels, and exchange, through the one or more storage channels and the one or more chip select lines, data with one or more storage medium particles electrically connected to the one or more chip select lines.

Optionally, each storage medium particle is a die.

Optionally, the hybrid storage device further includes a package structure, configured to package the at least one storage channel, the plurality of chip select lines, and the plurality of storage medium particles. The interface is configured to electrically connect the plurality of storage medium particles located inside the package to the external device, to exchange data between the plurality of storage medium particles and the external device.

A second aspect of this application provides a hybrid storage system, including the hybrid storage device and the external device according to any one of the first aspect to the third implementation of the first aspect. The external device includes a non-volatile controller that is electrically connected to the hybrid storage device and configured to exchange the data with the hybrid storage device. In this embodiment of this application, an NVRAM is introduced to storage medium particles, and features including high performance, long read/write endurance, and non-volatility of the NVRAM are used, thereby improving overall storage performance of the hybrid storage system and increasing efficiency of the hybrid storage system.

A third aspect of this application provides a hybrid storage device access method, including receiving an instruction sent by an external device, determining an address indicated by the instruction or a type of the instruction, enabling, based on the address or the type, one or more storage channels in at least one storage channel and one or more chip select lines in a plurality of chip select lines electrically connected to the one or more storage channels, where the plurality of chip select lines are electrically connected to a plurality of storage medium particles respectively, and the plurality of storage medium particles include an NVRAM and a flash memory, and exchanging, through the one or more storage channels and the one or more chip select lines, data with one or more storage medium particles electrically connected to the one or more chip select lines. In this embodiment of this application, an NVRAM is introduced to storage media, and features including high performance, long read/write endurance, and non-volatility of the NVRAM are used, thereby expanding a DDR synchronous dynamic RAM (SDRAM), improving overall storage performance of a hybrid storage device and increasing efficiency of a hybrid storage system.

In a possible design, in a first implementation of the third aspect of the embodiments of this application, the at least one storage channel includes at least one first storage channel and at least one second storage channel, the at least one first storage channel is connected to the NVRAM through a first chip select line, and the at least one second storage channel is connected to the flash memory through a second chip select line. The enabling, based on the address or the type, one or more storage channels in at least one storage channel and one or more chip select lines in a plurality of chip select lines electrically connected to the one or more storage channels includes, if the address of the instruction is an address of the NVRAM, enabling the at least one first storage channel and a chip select line connected to the at least one first storage channel, and accessing the NVRAM through the at least one first storage channel and the chip select line connected to the at least one first storage channel, or if the address of the instruction is an address of the flash memory, enabling the at least one second storage channel and a chip select line connected to the at least one second storage channel, and accessing the flash memory through the at least one second storage channel and the chip select line connected to the at least one second storage channel. Access control over the NVRAM and the flash memory that are connected to each storage channel is implemented by controlling enabling of each storage channel and the chip select lines that are connected to each storage channel.

In a possible design, in a second implementation of the third aspect of the embodiments of this application, the at least one storage channel is connected to at least one first chip select line and at least one second chip select line, the at least one first chip select line is connected to the NVRAM, and the at least one second chip select line is connected to the flash memory. The enabling, based on the address or the type, one or more storage channels in at least one storage channel and one or more chip select lines in a plurality of chip select lines electrically connected to the one or more storage channels includes, if the address of the instruction is an address of the NVRAM, enabling the at least one storage channel and the at least one first chip select line, and accessing the NVRAM through the at least one storage channel and the at least one first chip select line, or if the address of the instruction is an address of the flash memory, enabling the at least one storage channel and the at least one second chip select line, and accessing the flash memory through the at least one storage channel and the at least one second chip select line. Access control over the NVRAM and the flash memory that are connected to each storage channel is implemented by controlling enabling of each storage channel and the first chip select line and the second chip select line that are connected to each storage channel.

In a possible design, in a third implementation of the third aspect of the embodiments of this application, each chip select line is connected to one NVRAM, and the NVRAM is further connected to one flash memory. The enabling, based on the address or the type, one or more storage channels in at least one storage channel and one or more chip select lines in a plurality of chip select lines electrically connected to the one or more storage channels includes, if the type of the instruction is a type of a write operation instruction, enabling the at least one storage channel and the one or more chip select lines, where the write operation instruction is used to indicate writing target data. The exchanging, through the one or more storage channels and the one or more chip select lines, data with one or more storage medium particles electrically connected to the one or more chip select lines includes writing the target data into the flash memory if remaining space of the NVRAM is less than a size of the target data, or determining whether the target data is hot data if remaining space of the NVRAM is greater than or equal to a size of the target data, and writing the target data into the NVRAM if the target data is the hot data, or writing the target data into the flash memory if the target data is not the hot data. The chip select line connected to each storage channel is connected to the NVRAM and the flash memory in series, and different operations are performed based on the type of the instruction, to implement access control over the NVRAM and the flash memory that are connected in series on each storage channel.

In a possible design, in a fourth implementation of the third aspect of the embodiments of this application, each chip select line is connected to one NVRAM, and the NVRAM is further connected to one flash memory. The enabling, based on the address or the type, one or more storage channels in at least one storage channel and one or more chip select lines in a plurality of chip select lines electrically connected to the one or more storage channels includes if the type of the instruction is a type of a read operation instruction, enabling the at least one storage channel and the one or more chip select lines, where the read operation instruction is used to indicate reading target data. The exchanging, through the one or more storage channels and the one or more chip select lines, data with one or more storage medium particles electrically connected to the one or more chip select lines includes determining whether the target data exists in the NVRAM, and reading the target data from the NVRAM if the target data exists in the NVRAM, or reading the target data from the flash memory if the target data does not exist in the NVRAM. The chip select line connected to each storage channel is connected to the NVRAM and the flash memory in series, and different operations are performed based on the type of the instruction, to implement access control over the NVRAM and the flash memory that are connected in series on each storage channel.

In the embodiments of this application, an NVRAM is introduced to storage media, and features including high performance, long read/write endurance, and non-volatility of the NVRAM are used, thereby improving overall storage performance of the hybrid storage device and increasing efficiency of the hybrid storage system.

DESCRIPTION OF EMBODIMENTS

Embodiments of this application provide a hybrid storage device and an access method, to improve overall storage performance of the storage device.

The following clearly describes the technical solutions in the embodiments of this application with reference to the accompanying drawings in the embodiments of this application. Definitely, the described embodiments are merely some but not all of the embodiments of this application.

In this application, the terms "first", "second", and on the like are intended to distinguish similar objects but do not necessarily indicate a specific order or sequence. Moreover, the terms "include", "have" and any other variants in this application mean to cover the non-exclusive inclusion. For example, a process, method, system, product, or device that includes a list of steps or units is not necessarily limited to those expressly listed steps or units, but may include other steps or units not expressly listed or inherent to such a process, method, product, or device.

This application is applied to the field of storage media. A person skilled in the art has been researching and exploring a new storage medium, and expects that the new storage medium features both high performance and long read/write endurance similar to an LPDDR, and high density (large capacity) and non-volatility of a NAND, in other words, combines the advantages of the two. New media such as a resistive RAM (ReRAM), a ferroelectric RAM (FRAM), a magnetic RAM (MRAM), and a phase change memory (PCM) (such as a 3D XPOINT), and a conductive-bridging RAM (cbRAM) are collectively referred to as an NVRAM. These different NVRAM media operate differently. For example, in the ReRAM, a resistance of a material is in high and low resistance states depending on different voltages applied to a metal oxide, thereby recording "0" and "1". For another example, in the MRAM, a magneto-resistance difference caused by different magnetization directions of a free layer and a fixed layer is used to record "0" and "1". For another example, in the PCM, where the 3D XPOINT is used as an example, a phase (a crystalline state and an amorphous state) of a storage unit is changed by heating a cell unit, so as to express "0" and "1". A specific type of the NVRAM is not limited in this application. It should be noted that a flash memory in the embodiments of this application may be a NAND flash or a NOR flash. For ease of understanding, the NAND flash, NAND for short, is used as an example for description in the embodiments of this application.

Figure 1:
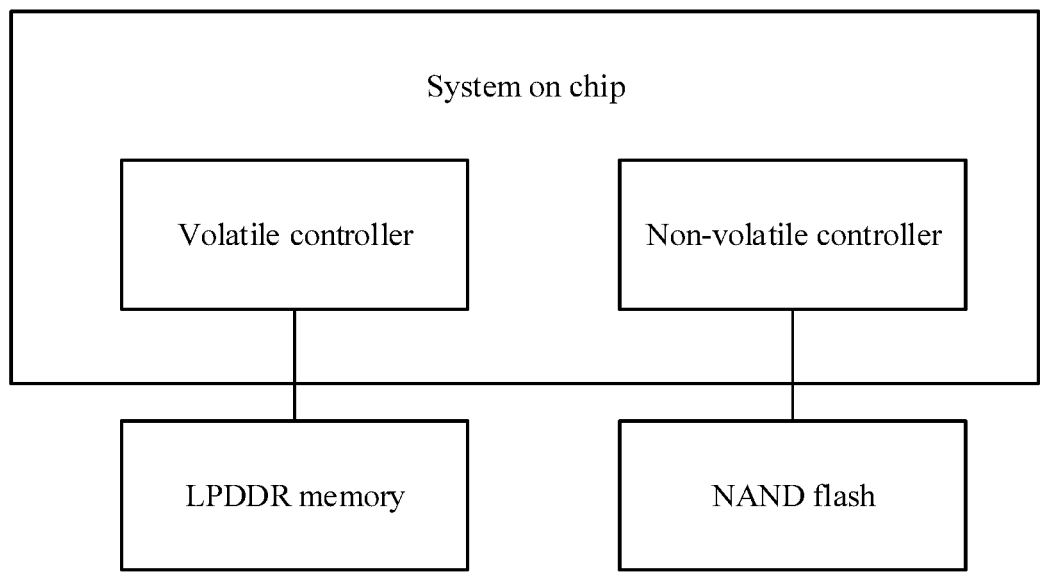
FIG. 1 is a schematic diagram of a storage structure of an existing storage solution.
Figure 2:
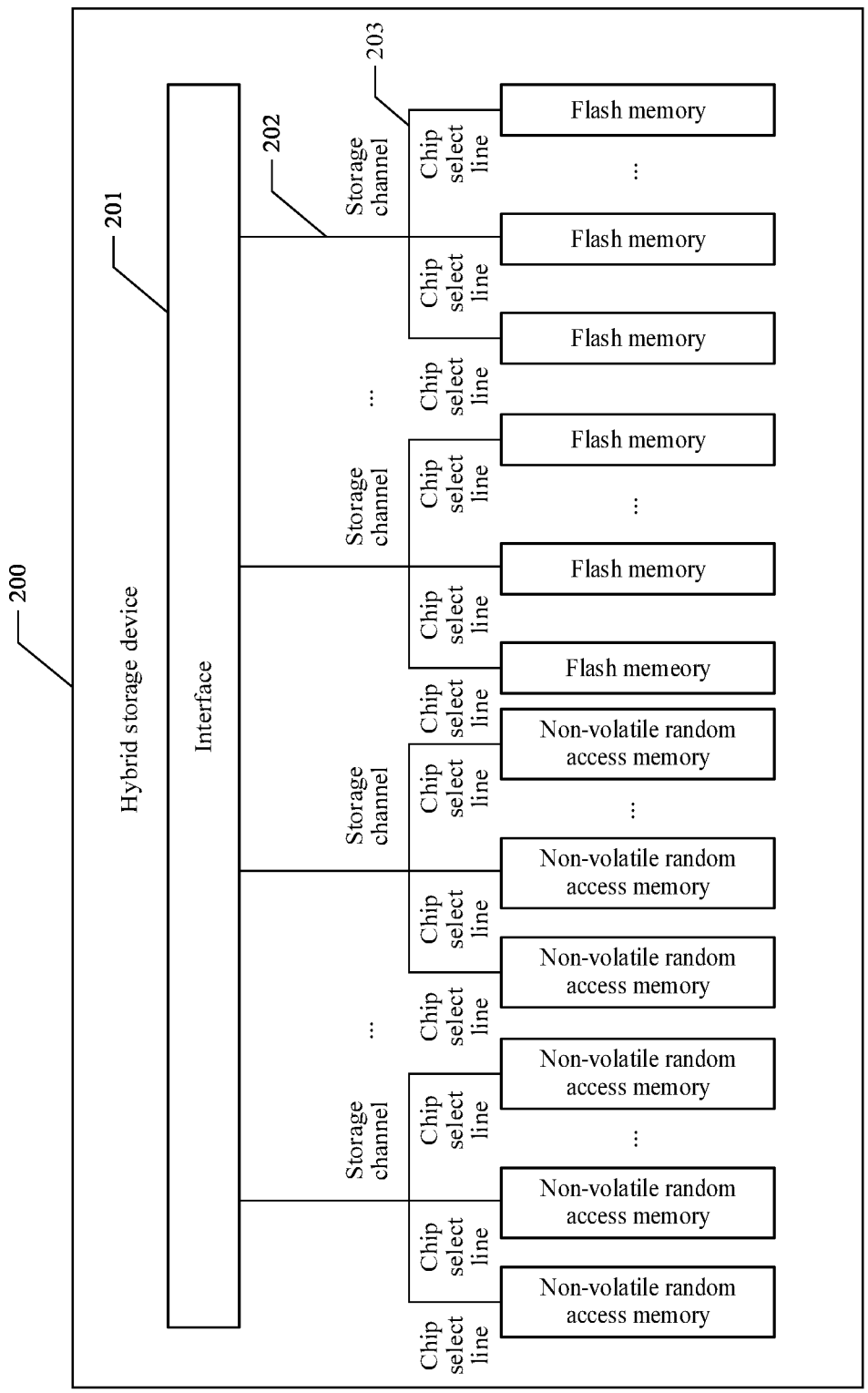
FIG. 2 is a schematic structural diagram of a hybrid storage device according to an embodiment of this application.

This application provides a hybrid storage device. Referring to FIG. 2, an embodiment of a hybrid storage device 200 in the embodiments of this application includes an interface 201, configured to electrically connect the hybrid storage device to an external device, and exchange data with the external device, at least one storage channel 202, electrically connected to the interface 201 and configured to exchange the data with the interface 201, a plurality of chip select lines 203, where each chip select line is electrically connected to one storage channel in the at least one storage channel and configured to exchange the data with the one storage channel, and a plurality of storage medium particles 204, where each storage medium particle is electrically connected to one chip select line and configured to exchange the data with the chip select line. The plurality of storage medium particles 204 include an NVRAM and a flash memory. Optionally, the hybrid storage device further includes a package structure (not shown in the figure), configured to package the at least one storage channel 202, the plurality of chip select lines 203, and the plurality of storage medium particles 204. The interface 201 is configured to electrically connect the plurality of storage medium particles 204 located inside the package to the external device, so as to exchange the data between the plurality of storage medium particles 204 and the external device. Packaging may be implemented by using an existing packaging technology.

It may be understood that the electrical connection may be a physical and direct electrical connection, or the electrical connection may be implemented by using a field-effect transistor (FET) or another element. This is not limited herein.

It should be noted that the interface 201 includes a physical layer device and a controller. The physical layer device is configured to exchange data with the external device. The controller is configured to enable one or more storage channels in the at least one storage channel, enable one or more chip select lines electrically connected to the one or more storage channels, and exchange, through the one or more storage channels and the one or more chip select lines, data with one or more storage medium particles electrically connected to the one or more chip select lines.

In this embodiment of this application, an NVRAM is introduced to storage media, and features including high performance, long read/write endurance, and non-volatility of the NVRAM are used, thereby expanding a DDR SDRAM, improving overall storage performance of the hybrid storage device, and increasing efficiency of a hybrid storage system.

It should be noted that the hybrid storage device provides an external port 201, for example, a Peripheral Component Interconnect Express (PCIe) interface, configured to interconnect with an SoC. Alternatively, the interface may be another interface, for example, a UFS interface or a Universal Serial Bus (USB) interface. This is not limited herein. Access to the NVRAM and the NAND are implemented through the interface communication. An internal architecture of the NVRAM and the NAND has three implementation solutions: (1) a channel selection solution, (2) a chip-select selection solution, and (3) a serial connection solution. The following describes the different solutions.

Figure 3:
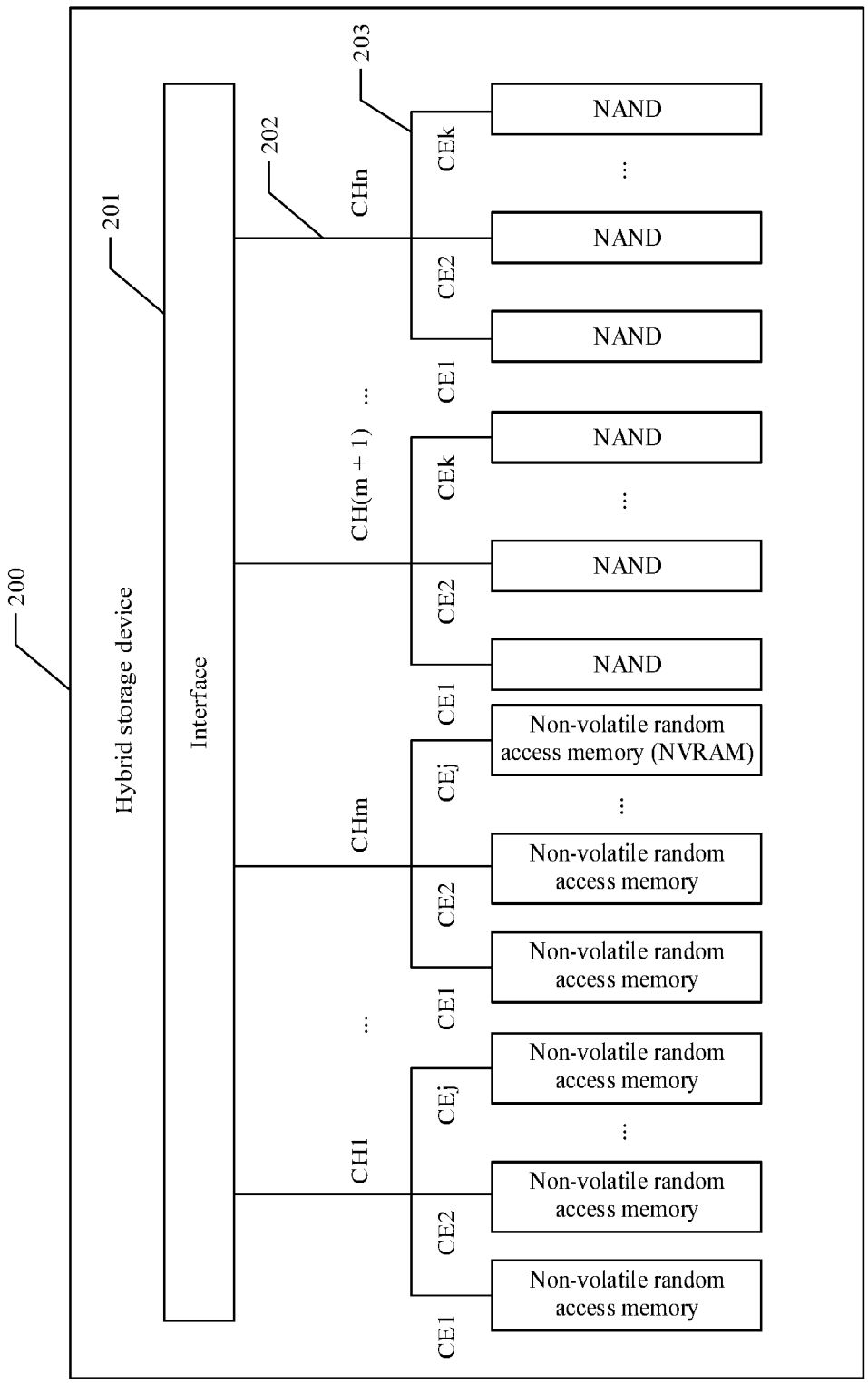
FIG. 3 is another schematic structural diagram of a hybrid storage device according to an embodiment of this application.

In a feasible implementation, as shown in FIG. 3, when the internal architecture of the NVRAM and the NAND is the channel selection solution, the flash memory may be a NAND, and the at least one storage channel 202 includes n storage channels (CH1 to CHn). The n storage channels include m first storage channels (CH1 to CHm) and n−m second storage channels (CH(m+1) to CHn). Each first storage channel (any one of CH1 to CHm) is connected to j NVRAMs through j first chip select lines (CE1 to CEj) in the plurality of chip select lines respectively. Each second storage channel (any one of CH(m+1) to CHn) is connected to k NANDs through k second chip select lines (CE1 to CEk) in the plurality of chip select lines respectively. Both n and m are positive integers, n is greater than m, and both j and k are positive integers.

In the channel selection solution, for the storage channels CH1 to CHm, all connected storage medium particles are NVRAMs, and j chip select lines, namely, chip select lines CE1 to CEj, can be enabled on each channel. Therefore, a maximum of m×j concurrent dies can be implemented. In actual application, a performance requirement and a power consumption constraint need be considered to strike a balance. For the storage channels CH(m+1) to CHn, all connected media are NANDs, and k chip select lines, namely, chip select lines CE1 to CEk, can be enabled on each channel. Therefore, a maximum of (n−m)×k concurrent dies can be implemented. In actual application, a performance requirement and a power consumption constraint need be considered to strike a balance. For the interface 201 (for example, the interface may be a PCIe controller), it may be considered that two different devices (an NVRAM device and a NAND device) are mounted. When the NVRAM device needs to be accessed, one or more of the channels CH1 to CHm are enabled, and the channels CH(m+1) to CHn are disabled. On the contrary, when the NAND device needs to be accessed, one or more of the channels CH(m+1) to CHn are enabled and the channels CH1 to CHm are disabled.

It should be noted that a die is a grain before IC is packaged, and is a small chip (die) obtained by cutting a semiconductor wafer by using a laser. Each die is an independent and unpackaged chip, and may include one or more circuits that will be packaged into one unit to become a common chip such as a memory chip and a central processing unit (CPU). One die in this embodiment corresponds to one storage medium particle. One die in this embodiment of this application may be an NVRAM device, or may be a NAND device.

In this implementation of this embodiment of this application, chip select lines connected to a same storage channel are connected to NVRAMs or NANDs, and access control over the NVRAMs or the NANDs connected to the storage channel is implemented by controlling enabling and disabling of the storage channel.

Figure 4:
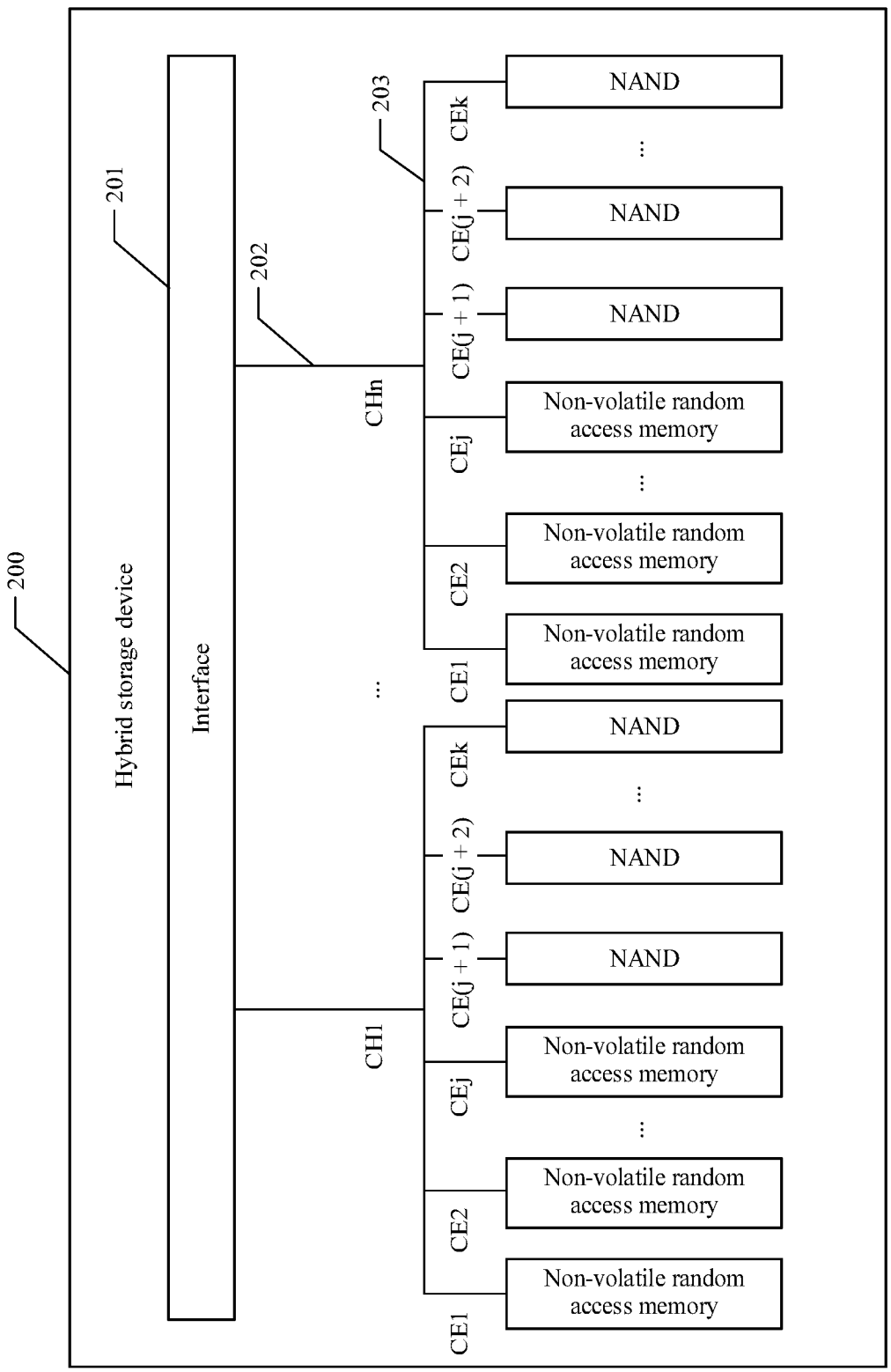
FIG. 4 is another schematic structural diagram of a hybrid storage device according to an embodiment of this application.

In a feasible implementation, as shown in FIG. 4, when the internal architecture of the NVRAM and the NAND is the chip-select selection solution, the flash memory may be a NAND, the at least one storage channel 202 includes n storage channels (CH1 to CHn), each storage channel is connected to k chip select lines, and the k chip select lines include j first chip select lines (CE1 to CEj) and k−j second chip select lines (CE(j+1) to CEk), where n, j, and k are all positive integers, and k is greater than j. Each first chip select line (any one of CE1 to CEj) is connected to one NVRAM, and each second chip select line (any one of CE(j+1) to CEk) is connected to one NAND.

In this chip-select selection solution, all storage channels, namely, channels CH1 to CHn, are connected to two types of storage medium particles: the NVRAM and the NAND. The first chip select lines (CE1 to CEj) are correspondingly connected to the NVRAMs, and the second chip select lines (CE(j+1) to CEk) are correspondingly connected to the NANDs. The NVRAM supports a maximum of n×j concurrent dies, while the NAND supports a maximum of n×(k−j) concurrent dies. In actual application, a performance requirement and a power consumption constraint need be considered to strike a balance. For the interface 201, it may be considered that two different devices (an NVRAM device and a NAND device) are mounted. When the NVRAM device needs to be accessed, the channels CH1 to CHn are enabled, the first chip select lines CE1 to CEj are enabled, and the second chip select lines CE(j+1) to CEk are disabled. On the contrary, when the NAND device needs to be accessed, the channels CH1 to CHn are enabled, the second chip select lines CE(j+1) to CEk are enabled, and the first chip select lines CE1 to CEj are disabled.

In this implementation of this embodiment of this application, the first chip select line and the second chip select line that are connected to the same storage channel are connected to the NVRAM and the NAND respectively. Access control over the NVRAM and the NAND connected to the storage channel is implemented by controlling enabling of the first chip select line and the second chip select line that are connected to the storage channel.

Figure 5:
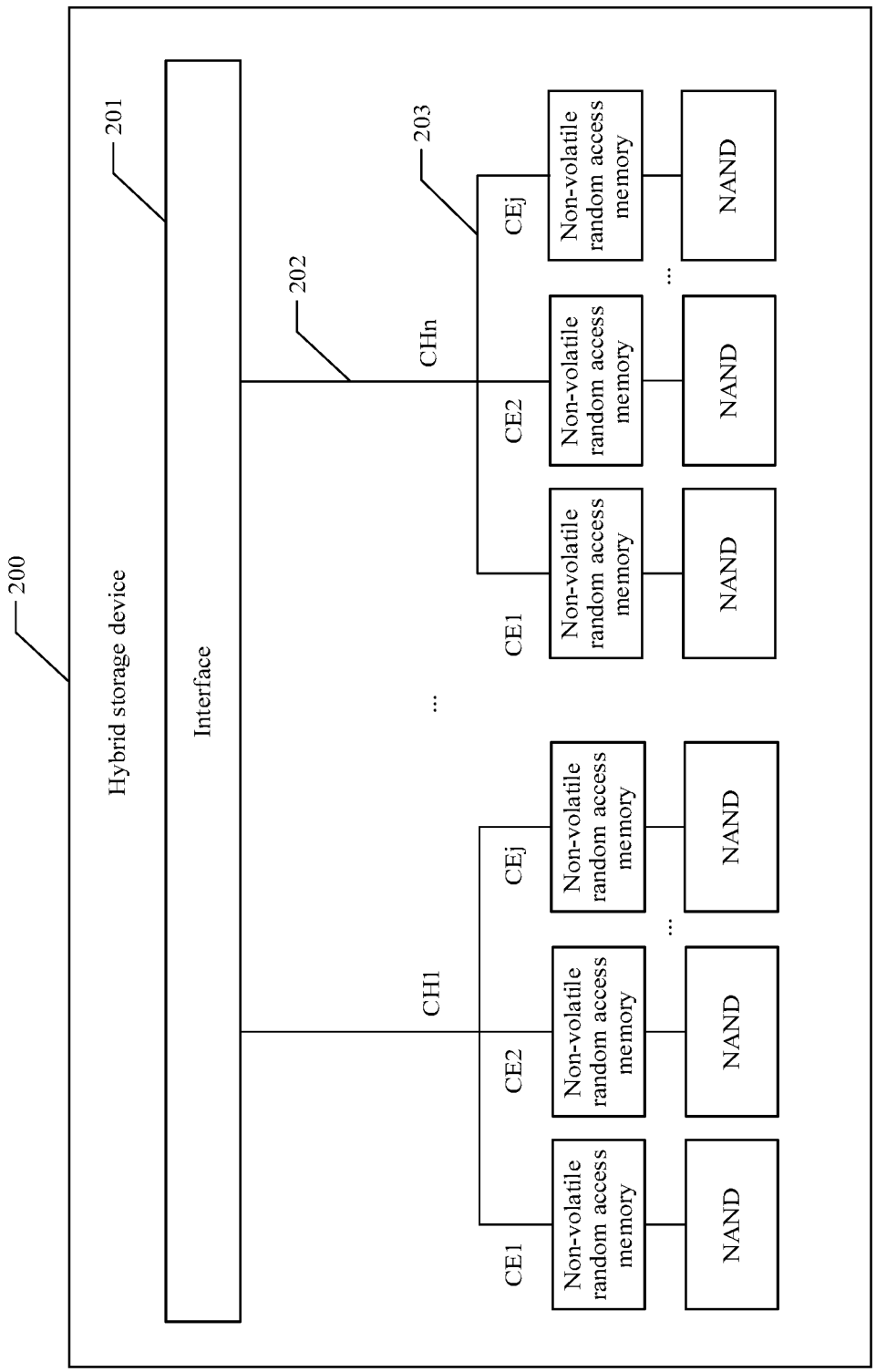
FIG. 5 is another schematic structural diagram of a hybrid storage device according to an embodiment of this application.

In a feasible implementation, as shown in FIG. 5, when the internal architecture of the NVRAM and the NAND is the serial connection solution, the at least one storage channel 202 includes n storage channels (CH1 to CHn), and each storage channel is connected to j chip select lines (CE1 to CEj), where n and j are positive integers. Each chip select line is connected to one NVRAM, and the NVRAM is further connected to one flash memory, to communicate the chip select line with the flash memory.

Figure 6:
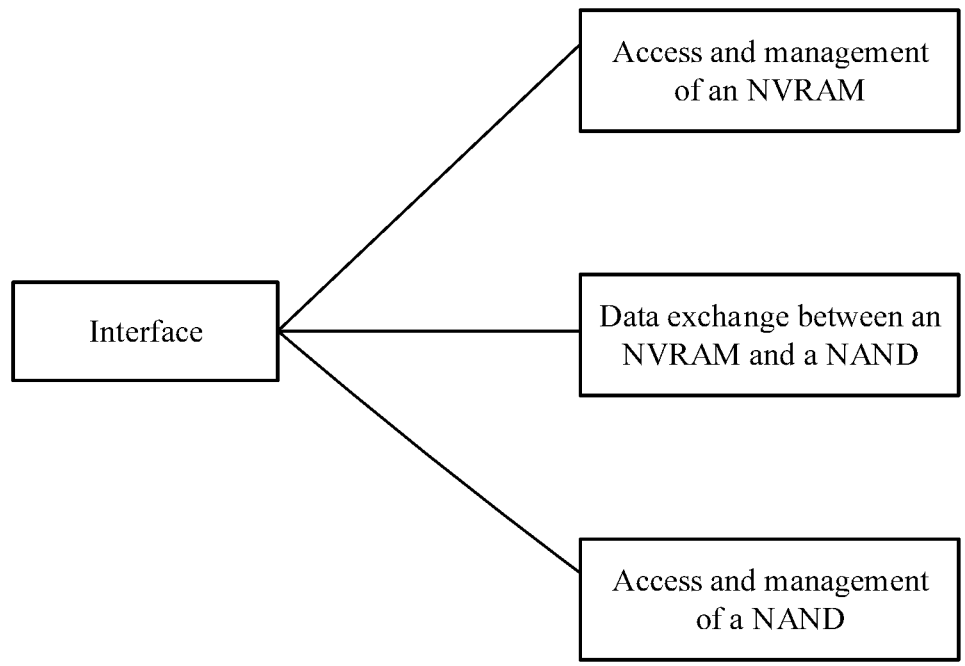
FIG. 6 is a schematic diagram of a function of an interface according to an embodiment of this application.

In this serial connection solution, each storage channel and chip select has both the NVRAM and NAND. All data entering the NAND needs to pass through the NVRAM first, as shown in FIG. 5. In this solution, the interface 201 needs to implement three basic functions, including: (1) access and management of the NVRAM, (2) data exchange between the NVRAM and the NAND, and (3) access and management of the NAND, as shown in FIG. 6.

Figure 7:
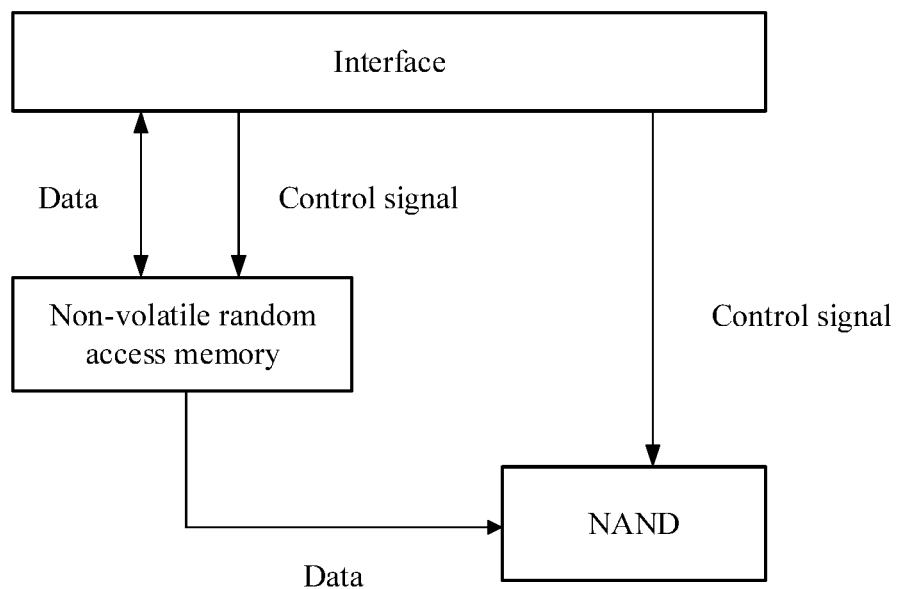
FIG. 7 is a schematic diagram of an interface controlling a storage medium particle according to an embodiment of this application.

The interface 201 sends a control signal to the NVRAM, and accesses and manages the NVRAM through a data bus. The interface 201 may further access and manage the NAND, for example, perform an operation such as garbage collection (GC), and the interface 201 needs to send a related control signal to the NAND. To exchange data between the NVRAM and the NAND, the interface 201 also needs to send a control signal to the NVRAM and the NAND, as further shown in FIG. 7.

For a write operation instruction for a hybrid storage medium, data is first written to the NVRAM, and then whether to write the data into the NAND is determined based on a situation such as a hot/cold data state or remaining space of the NVRAM. For a read operation instruction for a hybrid storage medium, required data is first to be read from the NVRAM, and if the NVRAM does not have the required data, then the required data is read from the NAND.

It should be noted that cold/hot data may be set based on an actual situation. For example, data that is frequently accessed in a short time is considered as hot data, and data that is not frequently accessed is considered as cold data. Further, an access quantity is set for each piece of data. When an access quantity of data in a period of time exceeds a preset threshold, the data is considered as hot data, and data other than the hot data is considered as cold data.

In this implementation of this embodiment of this application, a chip select line connected to each storage channel is connected to one NVRAM and one NAND in series, and different operations are performed based on a type of a received instruction, to implement access control over the NVRAM and the NAND that are connected in series on the storage channel.

In this embodiment of this application, in addition to being configured on a mobile terminal device such as a mobile phone, the hybrid storage device may further be applied to an apparatus involving application of a plurality of hybrid media such as a tablet (or IPAD), a notebook computer, or a server.

Figure 8:
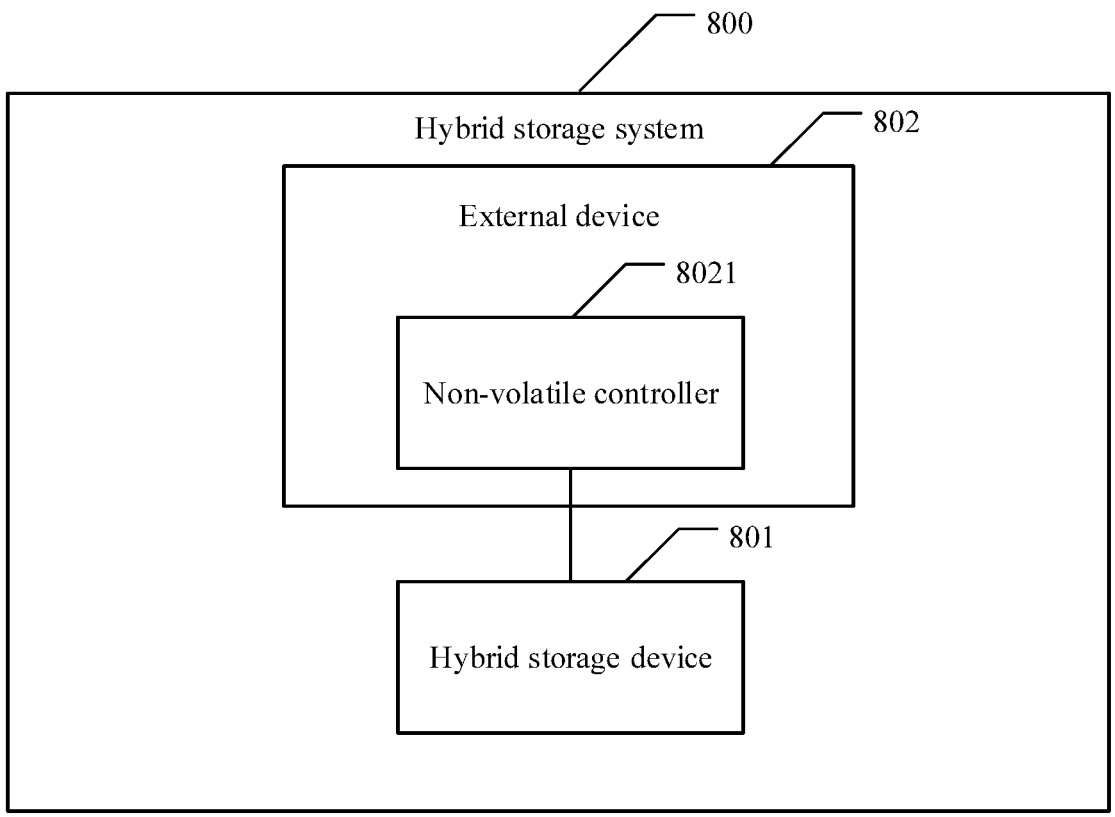
FIG. 8 is a schematic structural diagram of a hybrid storage system according to an embodiment of this application.

This application provides a hybrid storage system. Referring to FIG. 8, an embodiment of a hybrid storage system 800 in the embodiments of this application includes a hybrid storage device 801 and an external device 802. The external device 802 includes a non-volatile controller 8021, electrically connected to the hybrid storage device 801 and configured to exchange data with the hybrid storage device 801. The hybrid storage device 801 is the hybrid storage device according to the foregoing embodiments and any one of the implementations. Optionally, the hybrid storage system 800 may further include a volatile control module and a volatile storage medium device. The volatile control module is connected to the volatile storage medium device.

Figure 9:
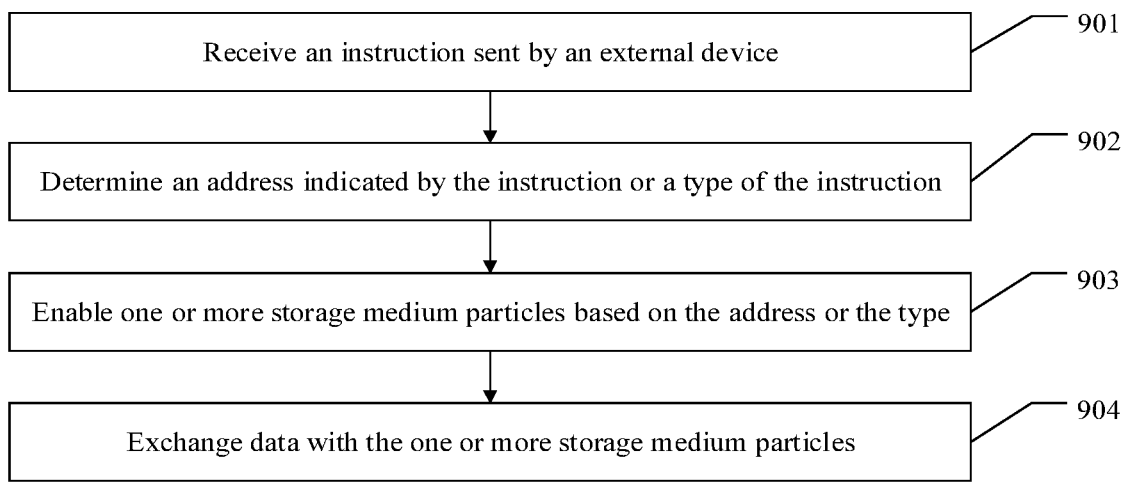
FIG. 9 is a schematic flowchart of a hybrid storage device access method according to an embodiment of this application.

Referring to FIG. 9, an embodiment of this application provides a hybrid storage device access method, applied to the hybrid storage device in the foregoing embodiments and implementations. The hybrid storage device includes at least one storage channel, a plurality of chip select lines, and a plurality of storage medium particles. The at least one storage channel is connected to the chip select lines, and the chip select lines are connected to the storage media. The method includes the following steps.

901: Receive an instruction sent by an external device.

902: Determine an address indicated by the instruction or a type of the instruction.

903: Enable, based on the address or the type, one or more storage channels in the at least one storage channel and one or more chip select lines in the plurality of chip select lines electrically connected to the one or more storage channels. The plurality of chip select lines are electrically connected to the plurality of storage medium particles respectively. The plurality of storage medium particles includes an NVRAM and a flash memory. (Enable one or more storage medium particles based on the address or the type.)

904: Exchange, through the one or more storage channels and the one or more chip select lines, data with one or more storage medium particles electrically connected to the one or more chip select lines. (Exchange data with the one or more storage medium particles.)

It should be noted that a control manner varies with an internal architecture of the NVRAM and the flash memory (a NAND in this embodiment of this application). A specific process is as follows:

(1) When the at least one storage channel includes at least one first storage channel and at least one second storage channel, the at least one first storage channel is connected to an NVRAM through a first chip select line, and the at least one second storage channel is connected to the flash memory through a second chip select line. To be specific, when a channel selection solution is used: if the address of the instruction is an address of an NVRAM, at least one first storage channel and a chip select line connected to the at least one first storage channel are enabled, and the NVRAM is accessed through the at least one first storage channel and the chip select line connected to the at least one first storage channel, or if the address of the instruction is an address of a flash memory, at least one second storage channel and a chip select line connected to the at least one second storage channel are enabled, and the flash memory is accessed through the at least one second storage channel and the chip select line connected to the at least one second storage channel.

(2) When the at least one storage channel is connected to at least one first chip select line and at least one second chip select line, the first chip select line is connected to an NVRAM, and the second chip select line is connected to a flash memory. To be specific, when a chip-select selection solution is used: if the address of the instruction is an address of an NVRAM, at least one storage channel and at least one first chip select line are enabled, and the NVRAM is accessed through the at least one storage channel and the at least one first chip select line, or if the address of the instruction is an address of a flash memory, at least one storage channel and at least one second chip select line are enabled, and the flash memory is accessed through the at least one storage channel and the at least one second chip select line.

(3) When each chip select line is connected to one NVRAM, and the NVRAM is further connected to one flash memory. To be specific, when a serial connection solution is used: if the type of the instruction is a type of a write operation instruction, at least one storage channel and one or more chip select lines are enabled, where the write operation instruction is used to indicate writing target data, and if remaining space of the NVRAM is less than a size of the target data, the target data is written into the flash memory, or if remaining space of the NVRAM is greater than or equal to a size of the target data, whether the target data is hot data is determined, and if the target data is hot data, the target data is written into the NVRAM, or if the target data is not hot data, the target data is written into the flash memory.

(4) When each chip select line is connected to one NVRAM, and the NVRAM is further connected to one flash memory. To be specific, when a serial connection solution is used if the type of the instruction is a type of a read operation instruction, at least one storage channel and one or more chip select lines are enabled, where the read operation instruction is used to indicate reading target data, whether the target data exists in the NVRAM is determined, and if the target data exists in the NVRAM, the target data is read from the NVRAM, or if the target data does not exist in the NVRAM, the target data is read from the flash memory.

In this embodiment of this application, an NVRAM is introduced to storage media, and features including high performance, long read/write endurance, and non-volatility of the NVRAM are used, thereby improving overall storage performance of the hybrid storage device and increasing efficiency of a system.

In the several embodiments provided in this application, it should be understood that the disclosed system, device (apparatus), and method may be implemented in other manners. For example, the described embodiment of the hybrid storage device is merely an example. In addition, the displayed or discussed mutual couplings or direct couplings or communication connections may be implemented through some interfaces. The indirect couplings or communication connections between the apparatuses or modules may be implemented in electronic, mechanical, or other forms.

The hybrid storage device according to the embodiments of this application may be sold or used as an independent product, or may be used as a computer-readable storage medium. The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

The invention claimed is:

1. A hybrid storage device comprising:
an interface configured to:
  electrically couple the hybrid storage device to an external device; and
  exchange data with the external device;
one or more first storage channels electrically coupled to the interface and configured to exchange the data with the interface;
a plurality of first chip select lines, wherein each of the first chip select lines is electrically coupled to one first storage channel in the one or more first storage channels and configured to exchange the data with the one first storage channel; and
a plurality of storage medium particles,
wherein each of the storage medium particles is electrically coupled to one first chip select line in the first chip select lines and configured to exchange the data with the one first chip select line,
wherein the storage medium particles comprise one or more non-volatile random-access memories (NVRAMs) and one or more flash memories, and
wherein each of the one or more first storage channels is coupled to j second chip select lines in the first chip select lines, wherein j is a positive integer, wherein each of the j second chip select lines is coupled to one NVRAM, and wherein the one NVRAM is further coupled to one flash memory to enable a corresponding j second chip select line to communicate with the one flash memory.

2. The hybrid storage device of claim 1, wherein each of the one or more first storage channels is configured to be enabled or disabled, and wherein each of the first chip select lines is configured to be enabled or disabled.

3. A hybrid storage system comprising:
an external device comprising a non-volatile controller; and
a hybrid storage device comprising:
  an interface configured to:
    electrically couple the hybrid storage device to the non-volatile controller; and
    exchange data with the external device;
  one or more first storage channels electrically coupled to the interface and configured to exchange the data with the interface;
  a plurality of first chip select lines, wherein each of the first chip select lines is electrically coupled to one first storage channel in the one or more first storage channels and configured to exchange the data with the one first storage channel; and
  a plurality of storage medium particles,
  wherein each of the storage medium particles is electrically coupled to one first chip select line in the first chip select lines and configured to exchange the data with the one first chip select line,
  wherein the storage medium particles comprise one or more non-volatile random-access memories (NVRAMs) and one or more flash memories, and
  wherein each of the one or more first storage channels is coupled to j second chip select lines in the first chip select lines, wherein j is a positive integer, wherein each of the j second chip select lines is coupled to one NVRAM, and wherein the one NVRAM is further coupled to one flash memory to enable a corresponding j second chip select line to communicate with the one flash memory.

4. A hybrid storage device access method comprising:
receiving an instruction from an external device;
determining an address indicated by the instruction or a type of the instruction;
enabling, based on the address or the type, one or more storage channels in a plurality of storage channels and one or more chip select lines in a plurality of chip select lines electrically coupled to the one or more storage channels, wherein the chip select lines are further electrically coupled to a plurality of storage medium particles, wherein the storage medium particles comprise a non-volatile random-access memory (NVRAM)

and a flash memory, wherein each of the chip select lines is coupled to the NVRAM, and wherein the NVRAM is further coupled to the flash memory;

exchanging, through the one or more storage channels and the one or more chip select lines, data with one or more storage medium particles that is in the storage medium particles and that is electrically coupled to the one or more chip select lines;

enabling the storage channels and the one or more chip select lines when the type is of a read operation instruction, wherein the read operation instruction instructs reading target data; and determining whether the target data exists in the NVRAM.

5. The hybrid storage device access method of claim 4, wherein the storage channels comprise:

a first storage channel coupled to the NVRAM through a first chip select line in the chip select lines; and a second storage channel coupled to the flash memory through a second chip select line in the chip select lines.

6. The hybrid storage device access method of claim 5, wherein the address is of the NVRAM, and wherein the hybrid storage device access method further comprises:

enabling the first storage channel and the first chip select line; and accessing the NVRAM through the first storage channel and the first chip select line.

7. The hybrid storage device access method of claim 5, wherein the address is of the flash memory, and wherein the hybrid storage device access method further comprises:

enabling the second storage channel and the second chip select line; and accessing the flash memory through the second storage channel and the second chip select line.

8. The hybrid storage device access method of claim 4, wherein the storage channels are further coupled to:

a first chip select line in the chip select lines, wherein the first chip select line is coupled to the NVRAM; and a second chip select line in the chip select lines, wherein the second chip select line is coupled to the flash memory.

9. The hybrid storage device access method of claim 8, wherein the address is of the NVRAM, and wherein the hybrid storage device access method further comprises:

enabling the storage channels and the first chip select line; and accessing the NVRAM through the storage channels and the first chip select line.

10. The hybrid storage device access method of claim 8, wherein the address is of the flash memory, and wherein the hybrid storage device access method further comprises:

enabling the storage channels and the second chip select line; and accessing the flash memory through the storage channels and the second chip select line.

11. The hybrid storage device access method of claim 4, further comprising:

enabling the storage channels and the one or more chip select lines when the type is of a write operation instruction, wherein the write operation instruction instructs writing target data; and writing the target data into the flash memory when remaining space of the NVRAM is less than a size of the target data.

12. The hybrid storage device access method of claim 4, further comprising:

enabling the storage channels and the one or more chip select lines when the type is of a write operation instruction, wherein the write operation instruction instructs writing target data;

determining whether the target data is hot data when remaining space of the NVRAM is greater than or equal to a size of the target data;

writing the target data into the NVRAM when the target data is the hot data; and writing the target data into the flash memory when the target data is not the hot data.

13. The hybrid storage device access method of claim 4, further comprising reading the target data from the NVRAM when the target data exists in the NVRAM.

14. The hybrid storage device access method of claim 13, further comprising reading the target data from the flash memory when the target data does not exist in the NVRAM.

* * * * *